(12) United States Patent
Lin et al.

(10) Patent No.: US 6,273,185 B1
(45) Date of Patent: Aug. 14, 2001

(54) HEAT SINK AND RETAINER FOR ELECTRONIC INTEGRATED DEVICES

(75) Inventors: Yeu-Lih Lin, Tu-Chen; Chao-Yang Lee, Taipei; Chao Kun Tseng, Tu-Chen, all of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/473,780

(22) Filed: Dec. 29, 1999

(30) Foreign Application Priority Data

Dec. 14, 1999 (TW) .................................. 88221283

(51) Int. Cl.⁷ ...................................... F28F 7/00
(52) U.S. Cl. .......................... 165/185; 165/80.3
(58) Field of Search .................. 165/80.3, 185; 361/697, 696, 702, 703, 709, 710; 257/719, 718, 727, 722

(56) References Cited

U.S. PATENT DOCUMENTS 5,155,661 * 10/1992 Nagesh et al. .................. 165/80.3 X
5,367,433 * 11/1994 Blomquist ........................ 165/185 X
5,377,745 * 1/1995 Hsieh .................................. 165/80.3
5,423,375 * 6/1995 Chiou ................................. 165/185 X
5,504,652 * 4/1996 Foster et al. ...................... 257/719 X
5,541,811 * 7/1996 Henningsson et al. .......... 165/185 X
5,748,446 * 5/1998 Feightner et al. ................ 165/185 X
5,886,870 * 3/1999 Omori ............................... 165/185 X
5,999,406 * 12/1999 McKain et al. .................. 165/80.3 X
6,037,660 * 3/2000 Liu .................................... 165/185 X

* cited by examiner

Primary Examiner—Christopher Atkinson
(74) Attorney, Agent, or Firm—Wei Te Chung

(57) ABSTRACT

A heat sink assembly for use in conjunction with an electronic integrated circuit, such as a chip, comprises a heat sink and a pair of retainers. The heat sink includes a plate defining a large number of fins and a flat bottom surface. A locking protrusion is formed at a proper position of each side of the plate. Each retainer comprises a transition portion, two engaging arms perpendicular to each other, and a nail beneath the transition portion. A rectangular sheath is formed on a distal end of each engaging arm for cooperating with a corresponding locking protrusion. Each nail includes a main body, a neck section, a protruding section and a cone section. A slot is defined through the lower portion of the section and through the protruding section and the cone section.

3 Claims, 4 Drawing Sheets

HEAT SINK AND RETAINER FOR ELECTRONIC INTEGRATED DEVICES

BACKGROUND OF THE INVENTION

1. Field of the Invention

The present invention relates to a heat sink assembly, and particularly to an easily assembled and low cost heat sink.

2. Description of Prior Art

Since the successful introduction of integrated circuits devices, there has been a steady progression toward larger IC devices to permit inclusion of a greater number of functions of the devices. The result is that quantity of heat produced by these larger semiconductor devices is getting larger and larger. To effectively dissipate the produced heat, heat sinks are used. To firmly attach the heat sinks to the IC devices, retainers are used. Examples of prior art heat sinks and retainers are disclosed in Taiwan patent application Nos. 83218644, and 85200861. Referring to FIG. 4, there is shown a printed circuit board (PCB) 60 on which a substrate 61 and a chip 64 is mounted. Two apertures 62 are defined in the PCB 60. A conventional heat sink 50 includes a plate 51 with a large number of integral fins 53 thereon. A pair of protrusion tabs 52 is provided on opposite angles of the plate 51 and each has an aperture 54. A pair of retainers 40 is formed by plastic injection molding. Each retainer 40 has a shape of a nail with a stem 42 having a pair of barbs 44 at a lower end thereof. A pair of helical springs 46 is provided for providing an elastic force to firmly attach the heat sink 50 to the chip 64. In assembly, the retainers 40 are extended through the springs, the aperture 54 in the tabs 52, and the apertures 62 in the PCB 60 to reach a position in which the barbs 44 engage a bottom face of the PCB 60, the springs 46 being compressed between the tabs 52 and heads (not labeled) of the retainers 40 thereby pushing the heat sink 50 downwardly to cause the heat sink 50 to closely engage with the chip 64.

To retain the heat sink on the chip, the prior art needs four components, i.e., two retainers 40 and two helical springs 46, which cause the inventory to be complicated and costly. Furthermore, the helical springs 46 are expensive components, which cause the whole cost of the heat sink assembly to be high. Hence, an improved electrical connector is required to overcome the disadvantages of the prior art.

SUMMARY OF THE INVENTION

A first object of the present invention is to provide an easily assembled and low cost heat sink with retainers.

Other objects, advantages and novel features of the invention will become more apparent from the following detailed description of the present embodiment when taken in conjunction with the accompanying drawings.

A heat sink assembly comprises a heat sink and a pair of retainers. The heat sink includes a plate with a flat bottom surface for abutting against an upper face of a chip and has a large number of fins that are integral with the plate. A locking protrusion is formed at a proper position of each sidewall of the plate. A pair of retainers each comprises a transition portion, two engaging arms perpendicular to each other, and a nail downwardly extending from the transition portion. Each engaging arm extends from the transition portion and slightly slops downwardly therefrom. A rectangular sheath is provided on a distal end of each engaging arm remote from the transition portion, and defines a channel having a shape in conformity to a profile of the locking protrusion so that the sheath can fittingly engage with the locking protrusion. The nail includes a main body, a neck section, a protruding section and a cone section. A slot is defined through a lower part of the neck section and through the protruding section and the cone section to create two bifurcated legs so that a lower end portion of the nail will have good resilience, allowing it to extend through a PCB and lock therewith.

DETAILED DESCRIPTION OF THE INVENTION

Figure 1:
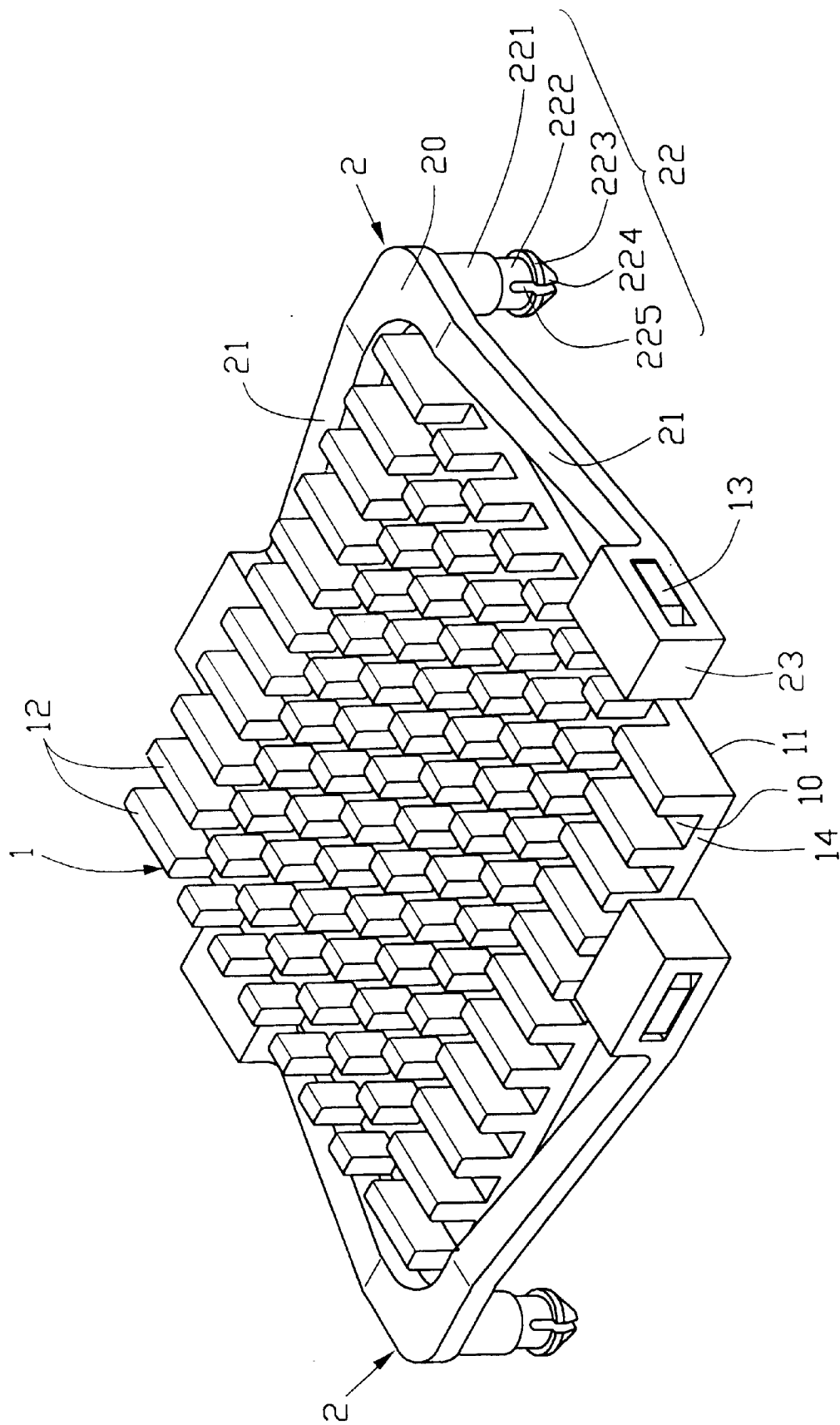
FIG. 1 is an assembled view of a heat sink assembly in accordance with the present invention.
Figure 2:
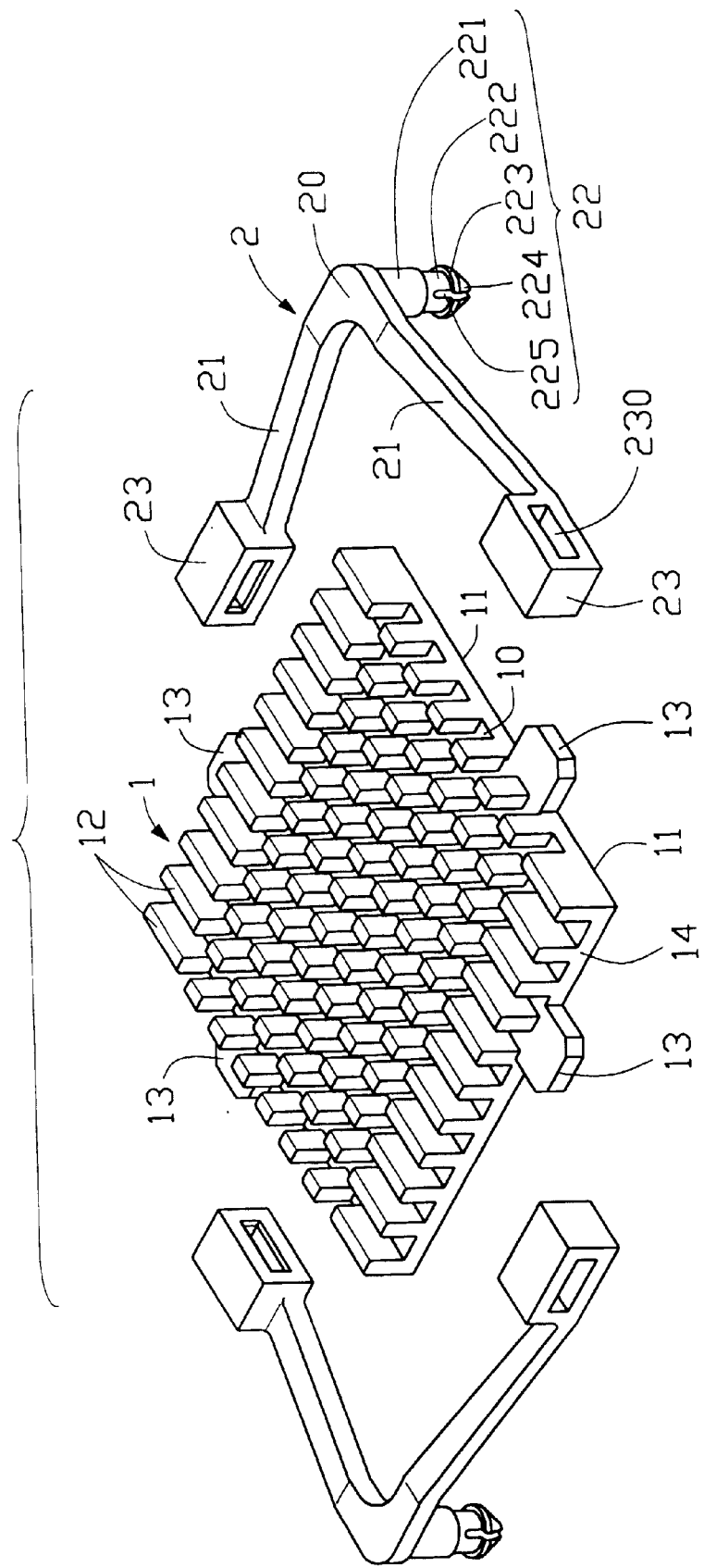
FIG. 2 is an exploded view of the heat sink assembly of FIG. 1.
Figure 3:
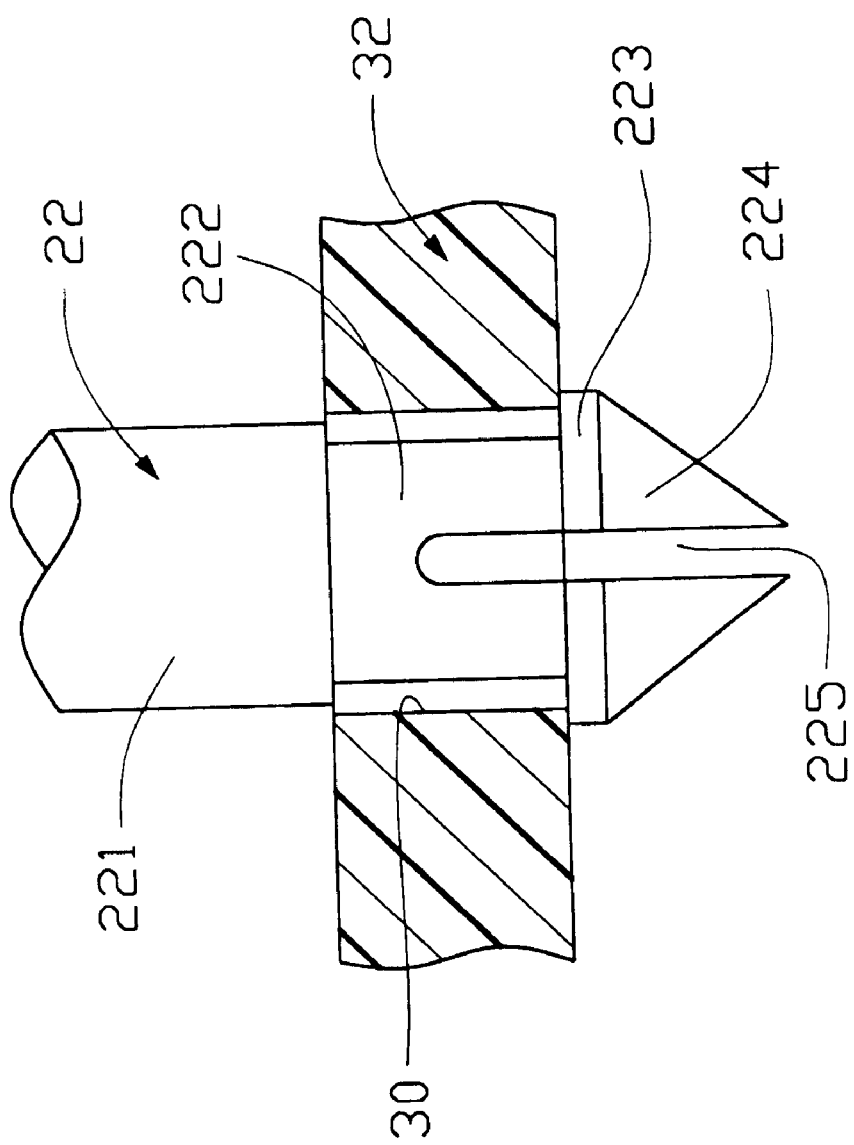
FIG. 3 is an assembled, cross-sectional view of a nail of one of the retainers in accordance with the present invention extending through a printed circuit board.
Figure 4:
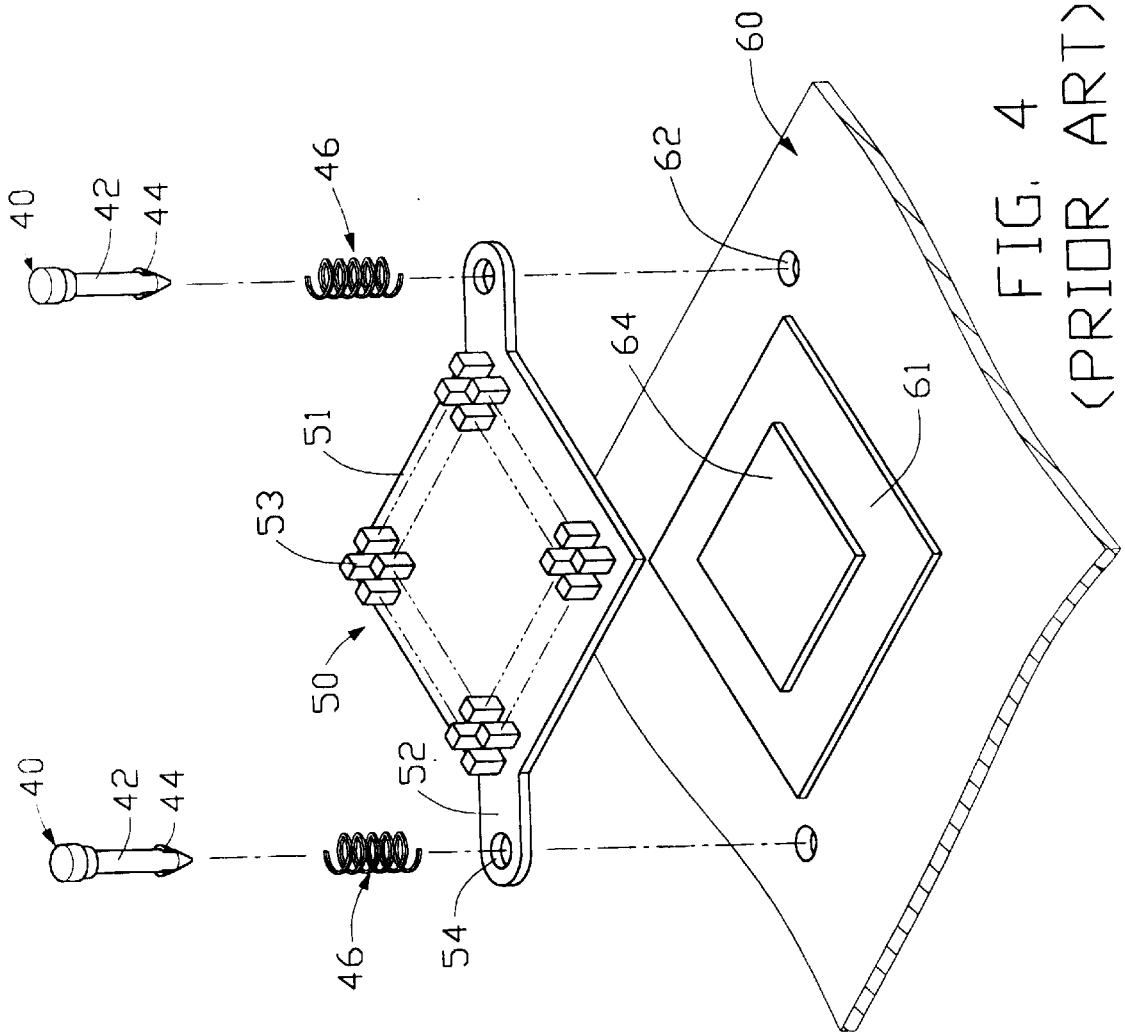
FIG. 4 is an exploded view of a conventional heat sink assembly.

Referring to FIGS. 1–3, a heat sink assembly comprises a heat sink 1 and a pair of retainers 2. The heat sink 1 includes a plate 10 with a flat bottom surface 11 for abutting against an upper face of a chip (not shown) and has a large number of fins 12 that are integral with the plate 10. A locking protrusion 13 is integrally formed on a proper position of each sidewall 14 of the plate 10. The heat sink is made of a material with a high thermal conductivity, such as aluminum.

The retainers 2 are each integrally formed by plastic injection molding with better resiliency than the heat sink 1. Each retainer 2 comprises a transition portion 20, two engaging arms 21 extending from the transition portion 20 and perpendicular to each other, and a nail 22 downwardly extending from the transition portion. Each engaging arm 21 slightly downwardly slopes from the transition portion 20. A rectangular sheath 23 is provided on a distal end of the each engaging arm 21 remote from the transition portion 20, and defines a channel 230 having a shape in conformity to a profile of the locking protrusion 13; thus, the sheathes can have a fitting engagement with the locking protrusions 13 by inserting the locking protrusions 13 into the channels 230 thereby locking the retainer 2 to the heat sink 1. The pair of engaging arms 21 may be optionally positioned from each other with slightly less than a right angle therebetween so as to retainably bias the heat sink 1 when said pair of retaining arms 21 are assembled to the corresponding right angle corner of the heat sink 1, thus enhancing securement between the retainer 2 and the heat sink 1. The nail 22 downwardly extends from the transition portion 20 and comprises a main body 221, a neck section 222, a protruding section 223 and a cone section 224. A slot 225 is defined through a lower portion of the neck section 222, the protruding section 223 and the cone section 224 to create a pair of bifurcated legs so that a lower end portion of each nail 22 possesses a certain degree of resilience. A board locking feature is provided by the protruding section 223 which projects outwardly from the neck section 222 and has a diameter larger than a bore diameter of a hole 30 in a printed circuit board (PCB) 32 on which the heat sink 1 is to be mounted when the legs are uncompressed. When the legs are forced into the hole 30 in the PCB 32, the legs will yield toward each other to allow insertion. When the protruding section 223 reaches the assembled position as shown in FIG. 3, the legs return outwardly to their unflexed positions whereby the protruding section 223 snaps into locking engagement with an underside of the PCB 32. The neck section 222 has a relatively small diameter in order to facilitate the legs biasing toward each other. To assemble the heat sink 1 to the PCB 32 so that the bottom surface 11 of the heat sink 1 can closely and firmly engage a chip mounted on the PCB 32, after the retainers 2 are assembled to the heat sink 1 as described above and shown in FIG. 1, a force is exerted to press the transition portions 20 downwardly to cause the nails 22 to extend through the holes 30 in the PCB 32 to reach a position such that the protruding sections 223 firmly engage with the PCB 30 as described above and as shown in FIG. 3. At this position, the engaging arms 21 are deformed to generate a compression force between the heat sink 1 and the chip (not shown), assuring a reliably intimate contact therebetween so that heat generated by the chip can be effectively absorbed and dissipated by the heat sink 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly for mounting onto a board-mounted heat-generating electronic element, comprising:

a heat sink adapted for placing upon the heat-generating electronic element and including a plate forming a locking protrusion on each of four sides thereof; and a pair of retainers each comprising a transition portion, two engaging arms each slightly sloping downward from the transition portion and having a sheath on a free end thereof, and a nail downwardly extending from the transition portion, the sheath defining a channel adapted for receiving the locking 13 protrusion therein.

2. The heat sink assembly in claim 1, wherein the nail includes a main body, a neck section, a protruding section and a cone section, a slot being defined through a lower portion of the neck section, and through the protruding section and the cone section to form two bifurcated legs.

3. The heat sink assembly in claim 2, wherein a diameter of the main body is greater than that of the neck section.

* * * * *